United States Patent [19]
Quast

[11] Patent Number: 5,317,282
[45] Date of Patent: May 31, 1994

[54] TETRODE BIASING CIRCUIT

[75] Inventor: Wilfried Quast, Ederstadt, Fed. Rep. of Germany

[73] Assignee: Temic Telefunken microelectronic GmbH, Heilbronn, Fed. Rep. of Germany

[21] Appl. No.: 953,718

[22] Filed: Sep. 30, 1992

[30] Foreign Application Priority Data

Oct. 16, 1991 [DE] Fed. Rep. of Germany ....... 4134176

[51] Int. Cl.$^5$ ............................................. A03F 3/16
[52] U.S. Cl. ................................. 330/277; 330/290; 330/293; 330/307
[58] Field of Search ............... 330/277, 290, 293, 307, 330/311

[56] References Cited

U.S. PATENT DOCUMENTS 4,658,220 4/1987 Heston et al. ................... 330/311 X

FOREIGN PATENT DOCUMENTS 2823662 12/1979 Fed. Rep. of Germany .
3017654 11/1981 Fed. Rep. of Germany .

OTHER PUBLICATIONS

Bauelemente der Elektrotechnik, Bd. 6, H. 47, 1971, pp. 54–60; R. Birchel: "Der Dual-Gate-MOS-FET..."

Primary Examiner—James B. Mullins
Attorney, Agent, or Firm—Spencer, Frank & Schneider

[57] ABSTRACT in a semiconductor array having a tetrode integrated in a semiconductor element, the tetrode comprises two field-effect transistors having a common semiconductor area forming the drain electrode of the first field-effect transistor and the source electrode of the second field-effect transistor. The semiconductor array has a three-pole array integrated in the semiconductor element and functioning as a feedback element, the input of the array is connected to the common semiconductor area of the tetrode. The output of the three-pole array is connected to the semiconductor area forming the gate electrode of the first field-effect transistor of the tetrode.

13 Claims, 1 Drawing Sheet

TETRODE BIASING CIRCUIT

DESCRIPTION OF THE PRIOR ART

In the VHF and UHF ranges, field-effect transistor tetrodes are often used in input circuits, amplifier circuits and mixer circuits. These tetrodes are usually two self-conducting n-channel field-effect transistors of the depletion type integrated in a cascode circuit, with the drain electrode of the first field-effect transistor doubling as the source electrode of the second field-effect transistor. This common electrode is designated as an island, and the corresponding common semiconductor area of the two field-effect transistors as the island area.

To block tetrodes of this type, the potential at the gate electrode must be negative in relation to the potential at the source electrode. This is usually achieved by a resistor between the source electrode and the reference potential, through which the source potential is increased. At the same time, this source resistor sets the operating point of the tetrode and, by compensating the temperature fluctuations and variations in the threshold voltage of the two field-effect transistors, stabilizes the operating point over a relatively wide range. For high-frequency applications, however, this source resistor must be bridged by a capacitor with a relatively high capacitance (of several nF). This capacitor cannot however be integrated into the semiconductor array and must instead be connected externally to a separate connection pin. Furthermore, the voltage drop caused by the source resistor makes more difficult the, often desired, reduction in the supply voltage of the semiconductor array (for example to 5 V).

SUMMARY OF THE INVENTION

The object underlying the invention is therefore to provide a semiconductor array having a tetrode integrated in a semiconductor element, with the tetrode comprising first and second field-effect transistors having a common semiconductor area that forms the drain electrode of the first field-effect transistor and the source of the second field-effect transistor, in which the drawbacks entailed by a source resistor can be avoided while at the same time retaining its positive effects.

This object is attained in accordance with the invention by a semiconductor array having a tetrode integrated in a semiconductor element as described above, wherein the semiconductor array has as a feedback element a three-pole array integrated in the semiconductor element, wherein the input of the three-pole array is connected to the common semiconductor area of the tetrode, and wherein the output of the three-pole array is connected to the semiconductor area forming the gate electrode of the first field-effect transistor of the tetrode.

Other advantageous embodiments of the invention include circuits in which the three-pole array is a resistive voltage divider, a resistive voltage divider combined with a field-effect transistor, or a resistive voltage divider combined with a bipolar transistor.

In the semiconductor array, a three-pole array acting as a feedback element is provided for setting and stabilizing the operating point of the tetrode, said array being integrated in the same semiconductor element as the field-effect transistor tetrode. The control potential for the feedback element is tapped at the common electrode (island) of the two tetrode field-effect transistors, and not generated by a source resistor, which is now no longer needed. This common electrode or the common semiconductor area of the two tetrode field-effect transistors (island area) is connected to the input of the three-pole array, of which the output is connected, preferably via a resistor, to the gate electrode of the first tetrode field-effect transistor, said gate forming the circuit input of the semiconductor array. The three-pole array has a voltage divider array whose first connection forms the input of the three-pole array and whose other connection is connected to the reference potential. The common connection or tap can, when the three-pole array is designed as a pure potentiometer array, form the output of the three-pole array or, when the three-pole array has a further active element (for example a transistor), be connected to the control input of this active element (for example the base electrode or gate electrode of a transistor), with the output of the active element (depending on type and circuit either the emitter electrode/collector electrode, or the source electrode/drain electrode of the transistor) then forming the output of the three-pole array.

With the control potential tapped at the island area of the tetrode, a suitable bias voltage is set, between the reference potential and the island potential, using the voltage divider of the three-pole array. Since the output of the three-pole array is connected to the gate electrode of the first tetrode field-effect transistor, for example via a resistor, the operating point of the tetrode is determined by this connection. In the event of a change to the drain current of the tetrode, the potential at the island area changes, for example this potential drops as drain current rises. The three-pole array picks up and processes this potential change and readjusts the operating point of the tetrode. The three-pole array therefore acts as the feedback element stabilizing the operating point of the tetrode.

If the three-pole array has an active element supplied by the potential at the island area, the conductivity of this element is changed as function of the potential at the island area. Changes to the drain current of the tetrode are fed back in amplified form as a result, so that automatic and very sensitive readjustment of the operating point of the tetrode takes place. If necessary, the supply voltage for the active element can also be tapped from the drain area of the field-effect transistor tetrode.

The control mechanism as described automatically eliminates the effects of temperature fluctuations and variations in the threshold voltage of the transistors on the operating point of the tetrode. The advantages of the source resistor and its positive effects are therefore achieved by the semiconductor array of the invention even without this source resistor. Dispensing with the source resistor however also affords further advantages for the semiconductor array that is the subject of the application:

- the monolithic integration of the entire semiconductor array in an integrated circuit is, particularly as a result of the now possible omission of a large-area capacitor, considerably facilitated,
- the operating point of the tetrode can be set without additional supply voltage,
- the total number of external connections of the semiconductor array or of the integrated circuit is restricted to four (the number required for the pure tetrode circuit), the operating voltage of the semiconductor array can be reduced, since the voltage can no longer drop across the source resistor.

As a rule, field-effect transistor tetrodes are operated with a drain current of several mA (for example 10 mA). Since no source resistor is now present, the threshold voltage of the field-effect transistor tetrode must be set, for example by an ion implantation, such that the two field-effect transistors are of the self-locking enhancement type. The potential of the island area is then almost the same as the potential (or in the case of a current flow slightly below the potential) at the gate electrode of the second tetrode field-effect transistor, said potential being as a rule set slightly above the potential at the gate electrode of the first tetrode field-effect transistor in the operating range of the tetrode.

The three-pole array acting as the feedback element can, in the simplest case, be designed as a potentiometer array comprising two resistors or as a combination of a potentiometer array and an active element with controllable conductivity, for example a field-effect transistor or a bipolar transistor. In the case of a transistor as the active element, its type and mode of connection must be selected such that at the output of the transistor, to which is connected the feedback connection to the gate electrode of the first tetrode field-effect transistor, the fluctuation of the island potential amplified by the transistor occurs.

BRIEF DESCRIPTION OF THE DRAWINGS

The semiconductor array of the invention is further described on the basis of two embodiments in which the three-pole array comprises in one case a potentiometer array with two resistors, and in another case a combination of a potentiometer array and a MOS transistor as the active element.

FIG. 1 is the circuit diagram of a semiconductor array with the tetrode and the three-pole array consisting only of resistors, while

DESCRIPTION OF THE PREFERRED EMBODIMENTS

Figure 1:
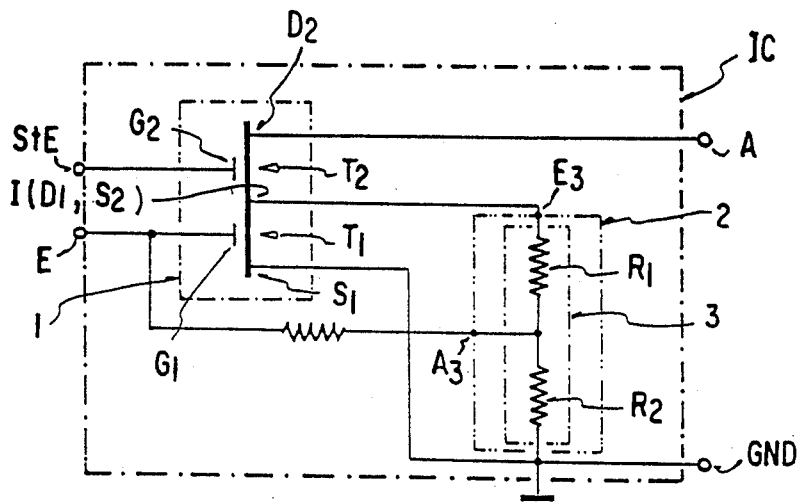

In accordance with FIG. 1, the tetrode 1 integrated in an integrated circuit IC is formed by the two field-effect transistors $T_1$ and $T_2$, with the gate electrode $G_1$ of the first field-effect transistor $T_1$ serving as the circuit input E of the integrated circuit IC, and the gate electrode $G_2$ of the second field-effect transistor $T_2$ as the control input StE of the integrated circuit IC for controlling the amplification. The source electrode $S_1$ of the first field-effect transistor $T_1$ is connected to the reference potential GND, while the drain electrode $D_2$ of the second field-effect transistor $T_2$ forms the circuit output A of the integrated circuit IC. Both field-effect transistors $T_1$ and $T_2$ have a common island electrode I that doubles as the drain electrode $D_1$ of the first field-effect transistor $T_1$ and as the source electrode $S_2$ of the second field-effect transistor $T_2$. The island electrode I is connected to the first connection (forming the input $E_3$ of the three-pole array) of the first resistor $R_1$ of the voltage divider 3. The tap of the voltage divider 3 is connected via the resistor $R_3$ to the gate electrode $G_1$ of the first field-effect transistor $T_1$ of tetrode 1, and to the reference potential GND via the second resistor $R_2$ of the voltage divider 3. The integrated circuit IC therefore only has four external connection pins: the circuit input E, the control input StE, the circuit output A, and the connection pin for the reference potential GND.

Figure 2:
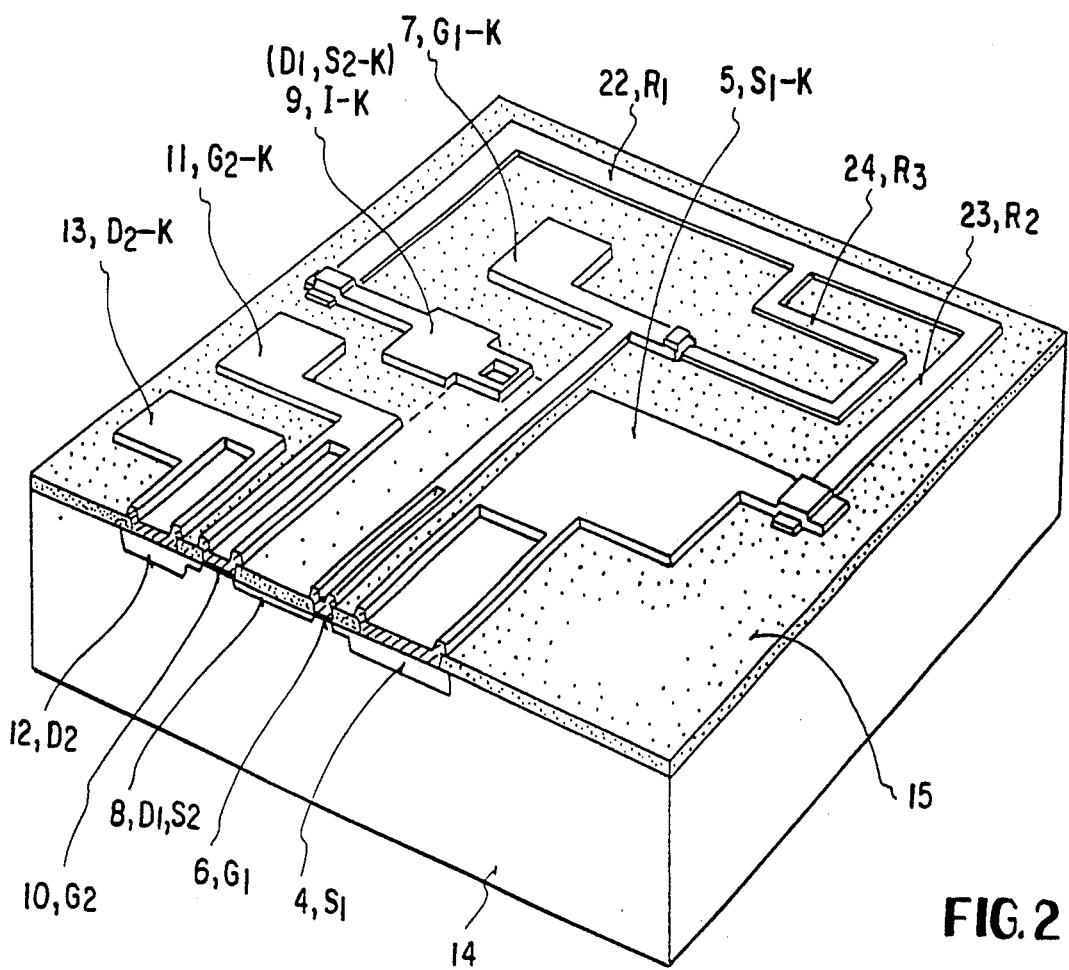
FIG. 2 is a perspective section through the corresponding semiconductor array.

Depending on the resistance value of the two resistors $R_1$ and $R_2$ of the voltage divider 3, the potential at the gate electrode $G_1$ of tetrode 1 is more or less greatly increased via the resistor $R_3$. It is therefore possible to set the operating point of the tetrode. On the other hand, effects of temperature fluctuations on the drain current and variations in the threshold voltage from the resultant fluctuations of the potential at the island electrode I are fed back to the gate electrode $G_1$, which in turn causes a readjustment of the drain current. The resistors $R_1$ to $R_3$ should have high resistance values, for example several k$\Omega$ to several 100 k$\Omega$, so that they do not cause interference in HF applications. FIG. 2 shows a diagrammatic section through a semiconductor array in which the tetrode 1 comprising two n-channel MOS field-effect transistors and the three-pole array 2 comprising two resistors are integrated together with the resistor $R_3$ in a common semiconductor element 14.

The source area 4 of the first field-effect transistor $T_1$ of tetrode 1 is contacted using the source contact 5. The two gate areas 6 and 10 of the two tetrode field-effect transistors $T_1$ and $T_2$ respectively are contacted using the gate contacts 7 and 11 respectively, and the drain area 12 of the second field-effect transistor $T_2$ of tetrode 1 using the drain contact 13. The two tetrode field-effect transistors $T_1$ and $T_2$ are connected to one another in a cascode circuit via the island area 8. The island area 8 and the connection zones of the drain area 12 and the source area 4 to the two gate areas 6 and 10, forming n-channels, are designed flatter than the drain area 12 and the source area 4. Contact of the island area 8 is achieved via the island contact 9, which can be made, for example, by contact diffusion of the same conductivity type as island area 8.

Furthermore, FIG. 2 also shows the resistors $R_1$ to $R_3$ shown in FIG. 1 and numbered 22 to 24. These resistors 22 to 24 are, for example, designed as polysilicon resistors on the insulating layer 15 covering the semiconductor element 14 and connected in the manner shown to the island contact 9, the gate contact 7 and the source contact 5.

Figure 3:
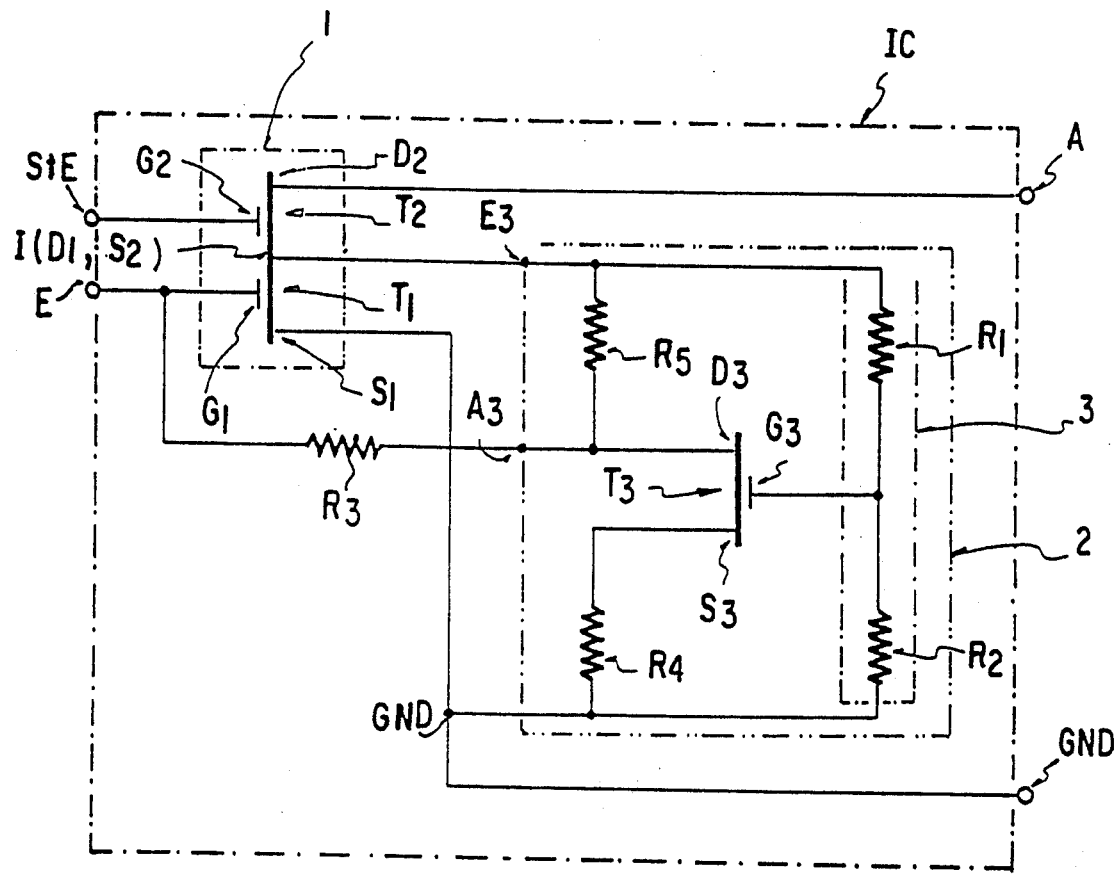
FIG. 3 is the circuit diagram of a semiconductor array with the tetrode and the three-pole array having one MOS transistor.

In accordance with the principle circuit diagram of FIG. 3, the pure potentiometer array of FIG. 1 is expanded by an active element designed as a field-effect transistor $T_3$, the gate electrode $G_3$ of which is connected to the tap of the voltage divider 3 consisting of the two resistors $R_1$ and $R_2$. The island electrode I (drain output $D_1$ of the first tetrode field-effect transistor $T_1$) is connected via the resistor $R_1$ of the voltage divider 3 to the gate electrode $G_3$ of the field-effect transistor $T_3$, and via the resistor $R_5$ to the drain electrode $D_3$ of the field-effect transistor $T_3$. The source electrode $S_3$ of the field-effect transistor $T_3$ is connected via the resistor $R_4$ to the source electrode $S_1$ of the first tetrode field-effect transistor $T_1$, which is connected to the reference potential GND. In addition, the drain electrode $D_3$ of the transistor $T_3$ is connected via the resistor $R_3$ to the gate electrode $G_1$ of the first tetrode field-effect transistor $T_1$.

Figure 3A:
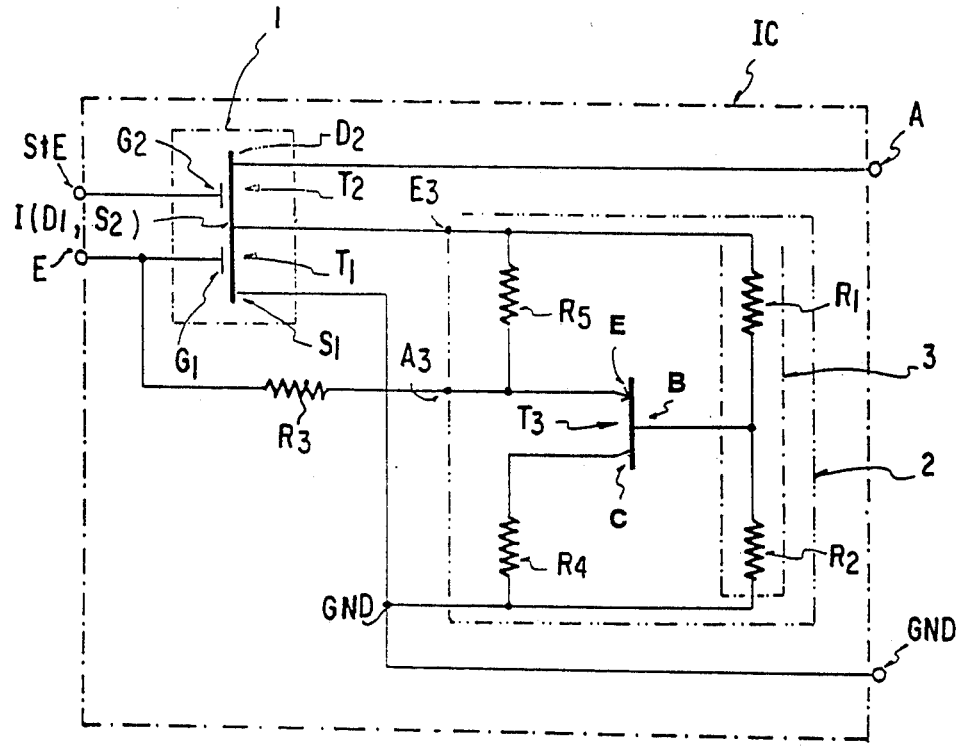
FIG. 3A is the circuit diagram of a semiconductor array with the tetrode and the three-pole array having one bipolar transistor.
Figure 3B:
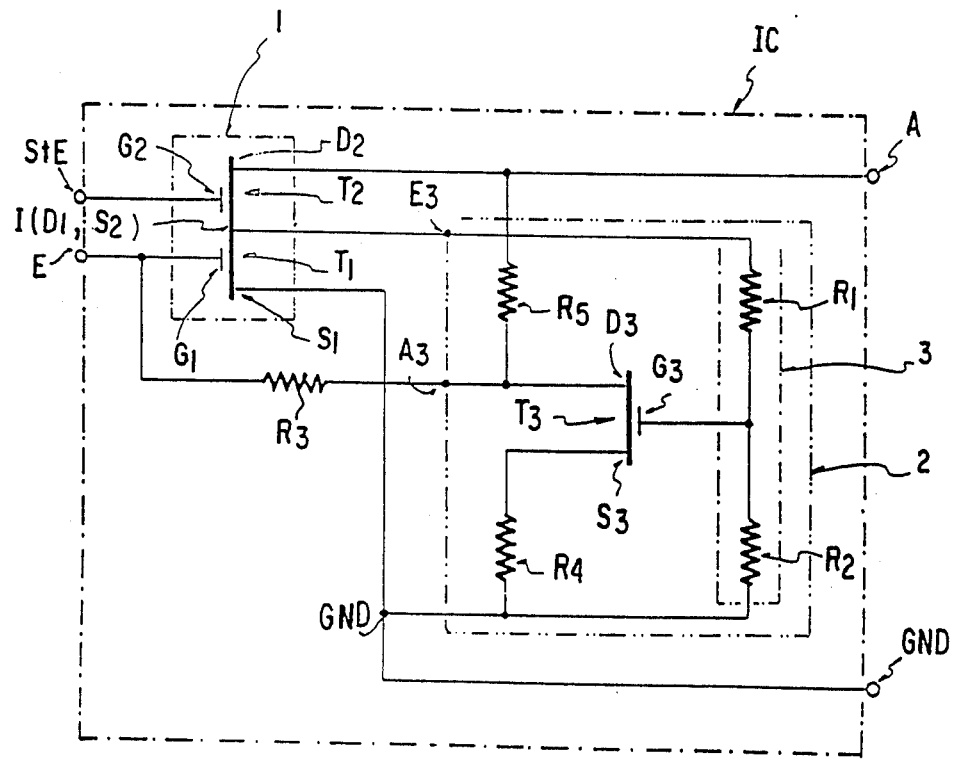
FIG. 3B is the circuit diagram of a semiconductor array with the tetrode and the three-pole array having the supply voltage for the active element tapped to the drain of the second field-effect transistor of the tetrode.

The operating point of the field-effect transistor tetrode 1 is set via the resistor $R_3$ using the control of the conductivity of the field-effect transistor $T_3$ via the resistors $R_1$ and $R_2$ of the voltage divider 3, and using the island potential available via resistor $R_5$ as the supply voltage. Fluctuations of the drain current of tetrode 1, caused for example by temperature changes or by variations of the threshold voltages, cause fluctuations, in the opposite direction, of the island potential. These are passed via the resistor $R_1$ to the gate input $G_3$ and at the same time via the resistor $R_5$ to the drain output $D_3$ of the field-effect transistor $T_3$. Since the latter is, in accordance with the invention, disposed on the same semiconductor element as the field-effect transistor tetrode 1 and in the vicinity of the latter, the conductivity of the field-effect transistor $T_3$ will also change and affect the potential at the drain output $D_3$ of the field-effect transistor $T_3$, also in the opposite direction. At the same time, the change in the voltage drop across the source resistor $R_4$ and the attendant change in the potential difference between the gate electrode $G_3$ and the source electrode $S_3$ causes a regulatory effect in the opposite direction, but this can be so attenuated by selection of a suitable resistor combination that the potential required for readjusting the tetrode 1 is automatically set at drain output $D_3$ of the transistor $T_3$ and hence also at the gate electrode $G_1$ of the field-effect tetrode 1. If a bipolar transistor is used as the active element in the three-pole array as shown in FIG. 3A, no impairment of the control characteristics occurs, so that the fluctuations of the island potential can be tapped in amplified form, if the transistor output has been selected appropriately, and passed via the resistor $R_3$ of the gate electrode $G_1$ to the field-effect transistor tetrode 1. As shown in FIG. 3B, according to another embodiment of the invention, the output $D_3$ of the active element $T_3$ of the three-pole array 2 can be connected via resistor $R_5$ to the drain output $D_2$ of the second field-effect transistor $T_2$ of the tetrode 1 for supplying voltage to the three-pole array 2.

Effects of temperature fluctuations on the drain current and production-related variations in the threshold voltage are very largely compensated and automatically equalized by the control mechanism described, and hence the operating point of the tetrode is automatically stabilized. The dimensioning of the field-effect transistor $T_3$ of the three-pole array 2, for example its mutual conductance and threshold voltage, depends on the application in question; however, similar values to those for the two individual field-effect transistors $T_1$ and $T_2$ of tetrode 1 can usually be selected. The resistance values of resistors $R_1$ to $R_5$ should be of the same magnitude as the values of the resistors $R_1$ to $R_3$ in accordance with FIG. 1.

Figure 4:
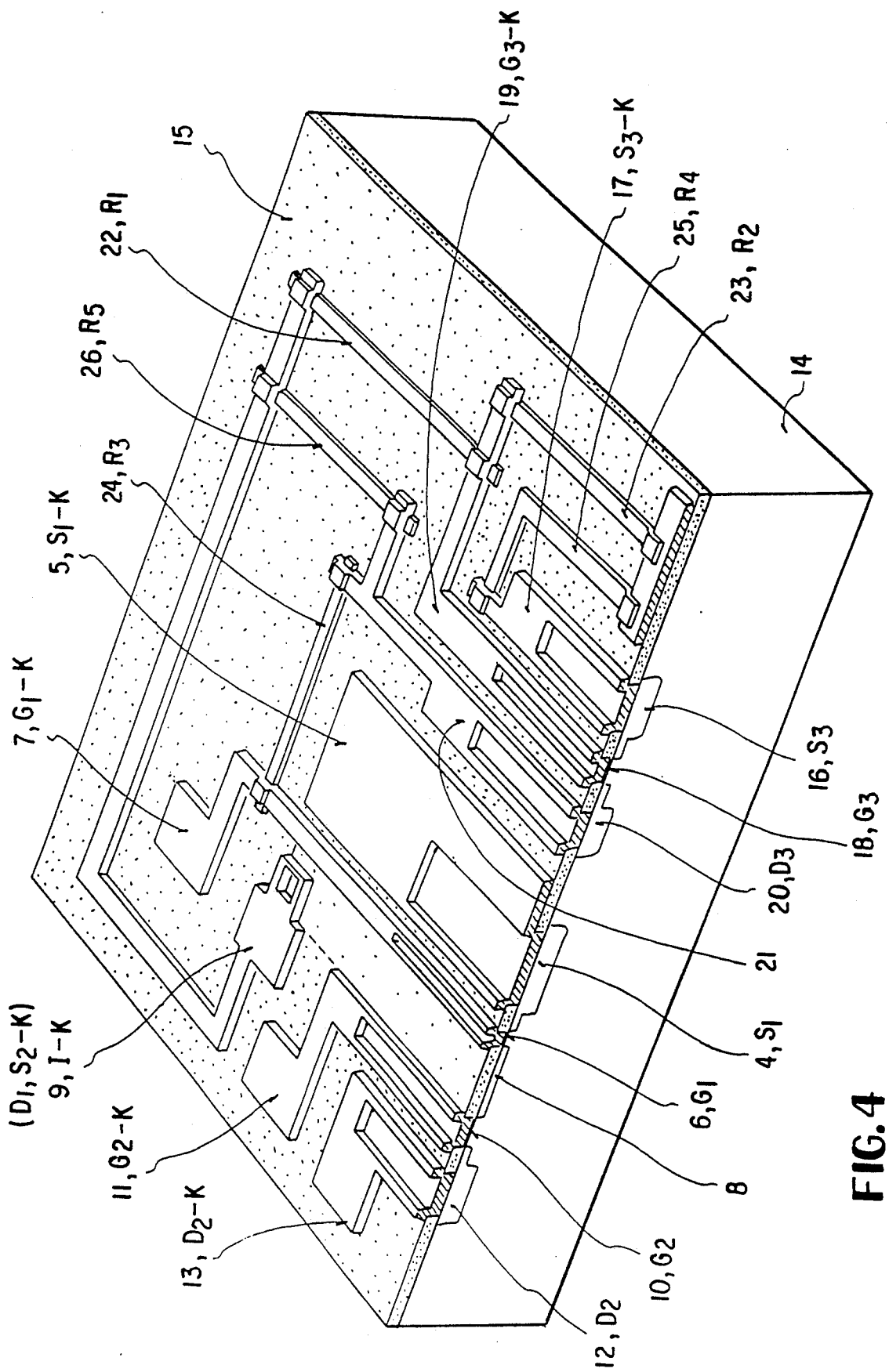
FIG. 4 is a perspective section through the corresponding semiconductor array of FIG. 3.

FIG. 4 is a diagram showing a perspective section through a semiconductor array in which the circuit shown in FIG. 3 is integrated on a common semiconductor element 14. The individual semiconductor areas of the tetrode and their contact connections have the same reference numbers as in FIG. 2.

The source area 16 of the field-effect transistor $T_3$ is connected via the source contact 17, the drain area 20 via the drain contact 21, and the gate area 18 via the gate contact 19. The resistors $R_1$ to $R_5$ are numbered 22 to 26 and, in accordance with the diagram in FIG. 3, connected to the appropriate contact areas of the field-effect transistors $T_1$, $T_2$ and $T_3$.

What is claimed is:

1. A semiconductor array having a tetrode integrated in a semiconductor element, said tetrode comprising a first and a second field-effect transistor having a common semiconductor area that forms the drain electrode of said first field-effect transistor and the source electrode of said second field-effect transistor, wherein said semiconductor array has as a feedback element a three-pole array integrated in said semiconductor element, wherein the input of said three-pole array is connected to said common semiconductor area of said tetrode, and wherein the output of said three-pole array is connected to the semiconductor area forming the gate electrode of said first field-effect transistor of said tetrode.

2. A semiconductor array according to claim 1, wherein said output of said three-pole array is connected via a first resistor to said semiconductor area forming said gate electrode of said first field-effect transistor of said tetrode.

3. A semiconductor array according to claim 2, wherein said first and second field-effect transistors of said tetrode are MOS transistors of the self-blocking enhancement type.

4. A semiconductor array according to claim 3, wherein said three-pole array comprises a voltage divider array having at least a first and a second voltage divider resistor, each having a first and a second end, and wherein said input of said three-pole array is formed by the first end of said first voltage divider resistor of said voltage divider array.

5. A semiconductor array according to claim 4, wherein the first end of said second voltage divider resistor of said voltage divider array is connected to reference potential.

6. A semiconductor array according to claim 5, wherein the second ends of said first and second voltage divider resistors are connected at a common connection to form said output of said three-pole array.

7. A semiconductor array according to claim 5, wherein said three-pole array further comprises an active element with controllable conductivity, wherein the second ends of said first and second voltage divider resistor are connected at a common connection, and wherein said common connection of said first and second voltage divider resistors is connected to the semiconductor area forming a control input of said active element.

8. A semiconductor array according to claim 7, wherein the semiconductor area forming the output of said active element forms said output of said three-pole array.

9. A semiconductor array according to claim 8, wherein said output of said active element of said three-pole array is connected via a second resistor to said input of said three-pole array.

10. A semiconductor array according to claim 8, wherein said output of said active element of said three-pole array is connected via a second resistor to the drain output of said second field-effect transistor of said tetrode for supplying voltage to said three-pole array.

11. A semiconductor array according to claim 7, wherein said active element of said three-pole array is a field-effect transistor.

12. A semiconductor array according to claim 11, wherein said field-effect transistor is a MOS field-effect transistor having the same conductivity type as said first and second tetrode field-effect transistors.

13. A semiconductor array according to claim 7, wherein said active element of said three-pole array is a bipolar transistor.

* * * * *